(12) United States Patent
Marsh et al.

(10) Patent No.: US 8,003,521 B2
(45) Date of Patent: Aug. 23, 2011

(54) SEMICONDUCTOR PROCESSING

(75) Inventors: Eugene P. Marsh, Boise, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 12/419,779

(22) Filed: Apr. 7, 2009

(65) Prior Publication Data
US 2010/0255653 A1 Oct. 7, 2010

(51) Int. Cl.
*H01L 21/4763* (2006.01)

(52) U.S. Cl. ........................................ 438/631

(58) Field of Classification Search ............ None
See application file for complete search history.

(56) References Cited

U.S. PATENT DOCUMENTS

| | | | |
|---|---|---|---|
| 5,990,559 A | 11/1999 | Marsh | |
| 6,197,628 B1 | 3/2001 | Vaartstra et al. | |
| 6,204,172 B1 | 3/2001 | Marsh | |
| 6,204,178 B1 | 3/2001 | Marsh | |
| 6,218,297 B1 | 4/2001 | Marsh | |
| 6,218,316 B1 | 4/2001 | Marsh | |
| 6,271,131 B1 | 8/2001 | Uhlenbrock et al. | |
| 6,281,161 B1 | 8/2001 | Marsh | |
| 6,284,655 B1 | 9/2001 | Marsh | |
| 6,323,081 B1 | 11/2001 | Marsh | |
| 6,323,511 B1 | 11/2001 | Marsh | |
| 6,342,445 B1 | 1/2002 | Marsh | |
| 6,387,802 B1 | 5/2002 | Marsh | |
| 6,403,414 B2 | 6/2002 | Marsh | |
| 6,403,499 B2 | 6/2002 | Marsh | |
| 6,421,223 B2 | 7/2002 | Marsh | |
| 6,461,909 B1 | 10/2002 | Marsh et al. | |
| 6,462,367 B2 | 10/2002 | Marsh et al. | |
| 6,495,458 B2 | 12/2002 | Marsh | |
| 6,506,666 B2 | 1/2003 | Marsh | |
| 6,545,287 B2 | 4/2003 | Chiang | |
| 6,569,689 B2 | 5/2003 | Marsh | |
| 6,569,705 B2 | 5/2003 | Chiang et al. | |
| 6,583,022 B1 | 6/2003 | Marsh | |
| 6,610,568 B2 | 8/2003 | Marsh et al. | |
| 6,617,634 B2 | 9/2003 | Marsh et al. | |
| 6,642,567 B1 | 11/2003 | Marsh | |
| 6,656,835 B2 | 12/2003 | Marsh et al. | |
| 6,660,631 B1 | 12/2003 | Marsh | |

(Continued)

FOREIGN PATENT DOCUMENTS

KR 100861296 B1 10/2008

(Continued)

OTHER PUBLICATIONS

International Search Report and Written Opinion for related PCT Application PCT/US2010/000733, mailed Oct. 14, 2010 (8 pgs.).

*Primary Examiner* — Charles D Garber
*Assistant Examiner* — Andre' C Stevenson
(74) *Attorney, Agent, or Firm* — Brooks, Cameron, Huebsch, PLLC

(57) ABSTRACT

Devices, methods, and systems for semiconductor processing are described herein. A number of method embodiments of semiconductor processing can include forming a silicon layer on a structure, forming an opening through the silicon layer and into the structure, and selectively forming a resistance variable material in the opening such that the resistance variable material does not form on the silicon layer.

18 Claims, 3 Drawing Sheets

U.S. PATENT DOCUMENTS

| | | | |
|---|---|---|---|
| 6,677,252 B2 | 1/2004 | Marsh | |
| 6,737,313 B1 | 5/2004 | Marsh et al. | |
| 6,737,317 B2 | 5/2004 | Marsh et al. | |
| 6,744,138 B2 | 6/2004 | Marsh | |
| 6,757,153 B2 | 6/2004 | Marsh | |
| 6,764,895 B2 | 7/2004 | Marsh et al. | |
| 6,783,657 B2 | 8/2004 | Marsh et al. | |
| 6,787,449 B2 | 9/2004 | Marsh | |
| 6,800,521 B2 | 10/2004 | Marsh | |
| 6,800,937 B2 | 10/2004 | Marsh et al. | |
| 6,813,136 B2 | 11/2004 | Marsh | |
| 6,830,983 B2 | 12/2004 | Marsh | |
| 6,858,535 B2 | 2/2005 | Marsh | |
| 6,861,355 B2 | 3/2005 | Marsh | |
| 6,867,093 B2 | 3/2005 | Marsh et al. | |
| 6,867,449 B2 | 3/2005 | Marsh et al. | |
| 6,881,260 B2 | 4/2005 | Marsh et al. | |
| 6,884,691 B2 | 4/2005 | Marsh | |
| 6,900,107 B2 | 5/2005 | Marsh | |
| 6,903,005 B1 | 6/2005 | Marsh | |
| 6,943,073 B2 | 9/2005 | Marsh et al. | |
| 6,946,395 B2 | 9/2005 | Marsh | |
| 7,030,042 B2 | 4/2006 | Vaartstra et al. | |
| 7,052,953 B2 | 5/2006 | Marsh | |
| 7,060,615 B2 | 6/2006 | Marsh | |
| 7,087,481 B2 | 8/2006 | Vaartstra et al. | |
| 7,098,503 B1 | 8/2006 | Marsh | |
| 7,105,065 B2 | 9/2006 | Marsh | |
| 7,115,528 B2 | 10/2006 | Vaartstra et al. | |
| 7,157,783 B2 | 1/2007 | Marsh | |
| 7,160,817 B2 | 1/2007 | Marsh | |
| 7,183,567 B2 | 2/2007 | Chiang | |
| 7,189,611 B2 | 3/2007 | Marsh | |
| 7,208,412 B2 | 4/2007 | Marsh | |
| 7,214,632 B2 | 5/2007 | Chiang | |
| 7,217,970 B2 | 5/2007 | Marsh | |
| 7,226,861 B2 | 6/2007 | Uhlenbrock et al. | |
| 7,262,132 B2 | 8/2007 | Marsh | |
| 7,282,408 B2 | 10/2007 | Marsh et al. | |
| 7,291,920 B2 | 11/2007 | Marsh | |
| 7,332,442 B2 | 2/2008 | Vaartstra et al. | |
| 7,364,935 B2 | 4/2008 | Lung | |
| 7,365,028 B2 | 4/2008 | Marsh | |
| 7,368,402 B2 | 5/2008 | Vaartstra et al. | |
| 7,371,429 B2 | 5/2008 | Lee et al. | |
| 7,384,825 B2 | 6/2008 | Park et al. | |
| 7,393,785 B2 | 7/2008 | Uhlenbrock et al. | |
| 7,416,994 B2 | 8/2008 | Quick | |
| 7,439,195 B2 | 10/2008 | Vaartstra et al. | |
| 7,453,111 B2 | 11/2008 | Ryoo et al. | |
| 7,468,108 B2 | 12/2008 | Marsh | |
| 7,473,637 B2 | 1/2009 | Kraus et al. | |
| 7,482,284 B2 | 1/2009 | Vaartstra et al. | |
| 2002/0008270 A1 | 1/2002 | Marsh | |
| 2003/0105455 A1* | 6/2003 | Santini et al. | 604/890.1 |
| 2004/0040863 A1 | 3/2004 | Lee et al. | |
| 2005/0016869 A1 | 1/2005 | Marsh et al. | |
| 2006/0014367 A1 | 1/2006 | Marsh | |
| 2006/0051963 A1 | 3/2006 | Marsh | |
| 2006/0091492 A1 | 5/2006 | Lee et al. | |
| 2006/0157863 A1 | 7/2006 | Marsh | |
| 2006/0160344 A1 | 7/2006 | Marsh et al. | |
| 2006/0180811 A1 | 8/2006 | Lee et al. | |
| 2006/0249369 A1 | 11/2006 | Marangon et al. | |
| 2006/0261441 A1 | 11/2006 | Marsh et al. | |
| 2007/0063245 A1 | 3/2007 | Marsh | |
| 2007/0075345 A1 | 4/2007 | Marsh | |
| 2007/0077441 A1 | 4/2007 | Marsh | |
| 2007/0092989 A1 | 4/2007 | Kraus et al. | |
| 2007/0166980 A1 | 7/2007 | Lee et al. | |
| 2007/0200243 A1 | 8/2007 | Kraus et al. | |
| 2007/0243491 A1 | 10/2007 | Wu et al. | |
| 2007/0246743 A1 | 10/2007 | Cho et al. | |
| 2007/0263340 A1 | 11/2007 | Marsh | |
| 2008/0006811 A1 | 1/2008 | Philipp et al. | |
| 2008/0217292 A1 | 9/2008 | Millward et al. | |
| 2008/0227303 A1 | 9/2008 | Vaartstra et al. | |
| 2008/0237566 A1* | 10/2008 | An et al. | 257/4 |
| 2008/0248653 A1 | 10/2008 | Marsh | |
| 2008/0258127 A1 | 10/2008 | Lee et al. | |
| 2008/0280455 A1 | 11/2008 | Quick | |
| 2008/0315270 A1 | 12/2008 | Marsh et al. | |
| 2009/0097305 A1* | 4/2009 | Bae et al. | 365/163 |
| 2009/0112009 A1* | 4/2009 | Chen et al. | 556/12 |

FOREIGN PATENT DOCUMENTS

| | | |
|---|---|---|
| WO | 2008057616 A2 | 5/2008 |

* cited by examiner

SEMICONDUCTOR PROCESSING

TECHNICAL FIELD

The present disclosure relates generally to semiconductor memory devices, methods, and systems, and more particularly, to devices, methods, and systems for semiconductor processing.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others.

Types of resistance variable memory include programmable conductor memory, phase change random access memory (PCRAM), and resistive random access memory (RRAM), among others. A physical layout of a PCRAM memory device may resemble that of a DRAM device, with the capacitor of the DRAM cell being replaced by a phase change material, such as Germanium-Antimony-Telluride (GST). A physical layout of an RRAM memory device may include memory cells including a variable resistor thin film, e.g., a colossal magnetoresistive material, which may be connected to an access device, such as a diode, a field effect transistor (FET), or a bipolar junction transistor (BJT), for example.

The memory cell material of a PCRAM device, e.g., GST, may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state, which may correspond to a data state. In a binary system, for example, the amorphous, higher resistance state may correspond to a data state of 1, and the crystalline, lower resistance state may correspond to a data state of 0. However, the choice of these corresponding data states may be reversed, that is, in other binary systems, the amorphous, higher resistance state may correspond to a data state of 0, and the crystalline, lower resistance state may correspond to a data state of 1. The resistance state of an RRAM cell, e.g., the variable resistor thin film, may be increased and/or decreased by applying positive and/or negative electrical pulses across the film. This may result in the RRAM cell being programmed to a particular resistance state.

Methods for processing, e.g., fabricating, memory, such as resistance variable memory, may include chemical vapor deposition (CVD) and atomic layer deposition (ALD), among others. CVD may include mixing a number of reactants in a chamber to form a material, e.g., a resistance variable material, which subsequently deposits across exposed surfaces of a number of semiconductor structures and/or substrates. ALD may include forming thin films of material by repeatedly depositing monoatomic layers in a chamber. For example, ALD may include individually depositing a number of reactants, e.g., precursors, that react in situ to form a desired film of material, e.g., resistance variable material, across a number of semiconductor structures and/or substrates.

More specifically, ALD may include introducing a first reactant in a chamber, which reacts with a number of structures and/or substrates to form a self limiting layer across the structures and/or substrates. After the layer is formed, the excess first reactant may be evacuated from the chamber, and a second reactant may be subsequently introduced in the chamber. The second reactant may react with the layer to convert the layer into a desired material, e.g., resistance variable material, layer over the structures and/or substrates.

DETAILED DESCRIPTION

Devices, methods, and systems for semiconductor processing are described herein. A number of method embodiments of semiconductor processing can include forming a silicon layer on a structure, forming an opening through the silicon layer and into the structure, and selectively forming a resistance variable material in the opening such that the resistance variable material does not form on the silicon layer.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the one or more embodiments of this disclosure, and it is to be understood that other embodiments may be utilized and that process, electrical, or mechanical changes may be made without departing from the scope of the present disclosure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

As used herein, "a number of" something can refer to one or more such things. For example, a number of memory devices can refer to one or more memory devices.

Figure 1A:
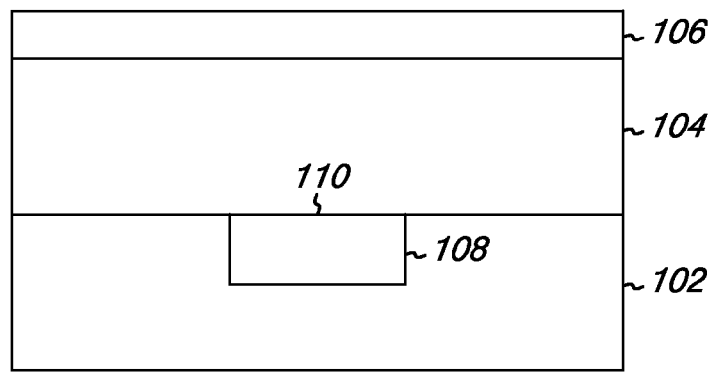
FIG. 1A illustrates a schematic cross-sectional view of a structure on a substrate, with a silicon layer on the structure.

FIG. 1A illustrates a schematic cross-sectional view of a structure 104 on a substrate 102, with a silicon layer 106 on structure 104. Substrate 102 can be a semiconductor substrate such as a base semiconductor layer, e.g., the underlying layer of silicon material on a semiconductive wafer, and/or a semiconductor substrate having a number of structures, layers, and/or or regions formed thereon. For example, substrate 102 can be silicon dioxide ($SiO_2$). However, embodiments of the present disclosure are not so limited. For example, substrate 102 need not be silicon based. Substrate 102 can also include a semiconductive wafer, e.g., substrate 102 can be a portion of a semiconductive wafer.

In the embodiment illustrated in FIG. 1A, structure 104 is shown formed, e.g., deposited, on substrate 102. Structure 104 can be formed on substrate 102 in a number of ways, including chemical vapor deposition (CVD) and atomic layer deposition (ALD), among other methods, as will be appreciated by one of skill in the art. Structure 104 can be, for example, a silicon nitride ($Si_3N_4$) stack formed on substrate 102. However, embodiments of the present disclosure are not so limited. For example, in a number of embodiments, structure 104 can be a part of, e.g., a layer or region, of a semiconductor substrate, such as substrate 102. Structure 104 can also include a number of layers or regions, e.g., structure 104 can include a number of different materials.

As shown in FIG. 1A, silicon layer 106 is formed, e.g., deposited, on structure 104. Silicon layer 106 can be, for example, a thin silicon film. Silicon layer 106 can be formed on structure 104 in a number of ways, including CVD and ALD, among other methods, as will be appreciated by one of skill in the art.

In the embodiment illustrated in FIG. 1A, substrate 102 includes electrode 108. Electrode 108 can be formed in substrate 102 before structure 104 is formed on substrate 102, as will be appreciated by one of skill in the art. Electrode 108 includes a surface 110 located adjacent to structure 104.

Figure 1B:
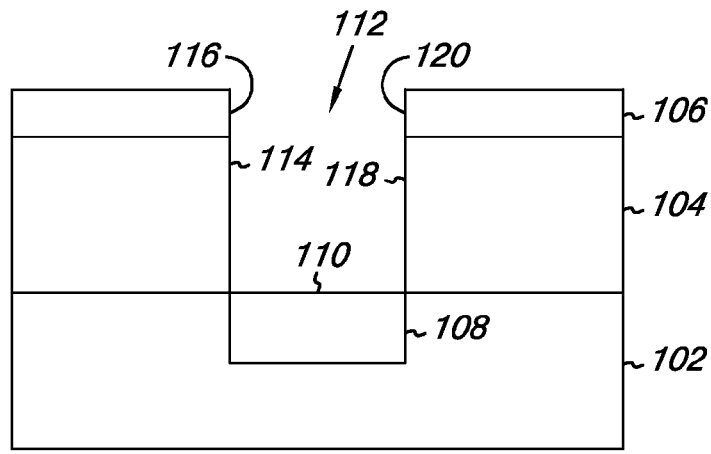
FIG. 1B illustrates a schematic cross-sectional view of a structure on a substrate, with a silicon layer on the structure and an opening through the silicon layer and into the structure.

FIG. 1B illustrates a schematic cross-sectional view of structure 104 on substrate 102, with silicon layer 106 on structure 104 and an opening, e.g., cylindrical container, 112 through silicon layer 106 and into structure 104. Opening 112 can be formed by removing a portion of silicon layer 106 and structure 104. Removing the portion of silicon layer 106 and structure 104, e.g., forming opening 112, can include, for example, a number of masking techniques, as the same are known and understood by one of skill in the art.

As shown in FIG. 1B, surface 110 of electrode 108 defines the bottom of opening 112. Also, surface 114 of structure 104 and surface 116 of silicon layer 106 define a first sidewall of opening 112, and surface 118 of structure 104 and surface 120 of silicon layer 106 define a second sidewall of opening 112. Although the sidewalls of opening 112 shown in FIG. 1B are parallel to each other, embodiments of the present disclosure are not so limited. For example, opening 112 can have shapes other than that shown in FIG. 1B.

In the embodiment illustrated in FIG. 1B, the surface of electrode 108 that defines the bottom of opening 112 is the same surface located adjacent to structure 104 in FIG. 1A, e.g., surface 110 is the surface that defines the bottom of opening 112 and the surface that is located adjacent to structure 104 in FIG. 1A. However, embodiments of the present disclosure are not so limited, e.g., the surface that defines the bottom of opening 112 can be a different surface than the surface located adjacent to structure 104 in FIG. 1A. For example, a portion of electrode 108, e.g., surface 110 shown in FIG. 1A, may be removed while opening 112 is being formed, exposing a different, e.g., new, surface of electrode 108 which can define the bottom of opening 112.

Opening 112 can have a width, e.g., a distance between the sidewalls, less than or equal to 35 nm. Further, opening 112 can have an aspect ratio, e.g., a ratio of the depth of the opening to the width of the opening, greater than or equal to 2:1. For example, opening 112 can have an aspect ratio of approximately 10:1. As used herein, an aspect ratio of approximately 10:1 can include aspect ratios within a range of 9:1 to 11:1. Such sidewall widths and/or aspect ratios can decrease the size, e.g., width of a semiconductor device, e.g., memory cell, which can increase the number of semiconductor devices, e.g., memory cells, which can be formed on a semiconductor wafer.

Figure 1C:
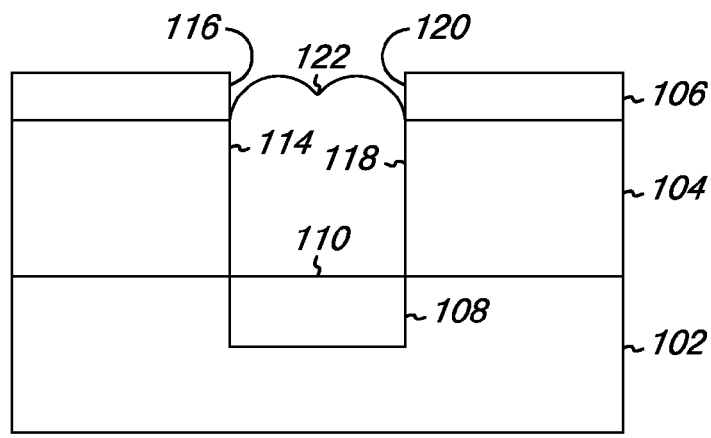
FIG. 1C illustrates a schematic cross-sectional view of a structure on a substrate, with a silicon layer on the structure, and a resistance variable material in an opening through the silicon layer and into the structure.

FIG. 1C illustrates a schematic cross-sectional view of structure 104 on substrate 102, with silicon layer 106 on the structure, and a resistance variable material 122 in opening 112. Resistance variable material 122 can be, for example, a phase change material. According to a number of embodiments of the present disclosure, a phase change material can include, for example, a Germanium-Antimony material, e.g., a Ge—Sb material. A phase change material can also include a phase change chalcogenide alloy such as a Germanium-Tellurium material, e.g., a Ge—Te material. The hyphenated chemical composition notation, as used herein, indicates the elements included in a particular mixture or compound, and is intended to represent all stoichiometries involving the indicated elements.

As shown in FIG. 1C, resistance variable material 122 is selectively formed, e.g., selectively deposited, in opening 112. As used herein, selectively forming resistance variable material 122 in opening 112 can include forming resistance variable material 122 in opening 112 such that resistance variable material 122 does not form on silicon layer 106, e.g., such that resistance variable material 122 is formed exclusively in opening 112. For example, resistance variable material 122 can be selectively formed in opening 122 such that no resistance variable material is formed on silicon layer 106, e.g., such that opening 112 is the only location in which resistance variable material 122 is formed.

Additionally, selectively forming resistance variable material 122 in opening 112 can also include forming resistance variable material 122 in opening 112 such that resistance variable material 122 covers the bottom of opening 112, e.g., surface 110 of electrode 108, and the portions of the sidewalls of opening 112 defined by surfaces 114 and 118 of structure 104. For example, selectively forming resistance variable material 122 can in opening 112 can include forming resistance variable material 122 in opening 112 such that resistance variable material 122 does not cover the portions of the sidewalls of opening 112 defined by surfaces 116 and 120 of silicon layer 106, as shown in FIG. 1C.

Further, selectively forming resistance variable material 122 in opening 112 can also include forming resistance variable material 122 in opening 112 such that resistance variable material 122 fills the portion of opening 112 formed by the bottom of opening 112, e.g., surface 110 of electrode 108, and the portions of the sidewalls of opening 112 defined by surfaces 114 and 118 of structure 104, as shown in FIG. 1C. Selectively forming resistance variable material 122 such that resistance variable material is in contact with electrode 108, as shown in FIG. 1C, can provide an electrical contact to resistance variable material 122.

Resistance variable material 122 can be selectively formed, e.g., selectively deposited, in opening 112 using a number of reactants, e.g., precursors, in a CVD and/or ALD process. In a number of embodiments, a Ge—Sb phase change material is selectively formed in opening 112 using an ALD process which includes sequential surface reactions of a germanium amidinate, or amine, and ammonia (NH$_3$), and Sb(OR)$_3$ and ammonia, wherein R is an alkyl. That is, the ALD process includes reacting a germanium amidinate, or amine with ammonia and reacting Sb(OR)$_3$ with ammonia in a sequential, e.g., alternating, manner. The germanium amidinate can be, for example, an amidinate such as GeBAMDN (C$_{22}$H$_{46}$GeN$_4$, e.g., bis(N,N'-diisopropyl-N-butylamidinate) germanium(II)). The amine can be, for example, Ge(NR$_2$)$_4$, wherein R is alkyl group. For example, the amine can be Ge(NCH$_3$)$_4$. Sb(OR)$_3$ can be, for example, antimony III ethoxide (C$_6$H$_{15}$O$_3$Sb, e.g., antimony ethylate.

Additionally, in a number of embodiments a Ge—Te phase change material is selectively formed in opening 112 using an ALD process which includes sequential surface reactions of germanium amidinate, or amine, and ammonia, and Te(OR)$_4$ and ammonia, wherein R is an alkyl. That is, the ALD process includes reacting a germanium amidinate, or amine, with ammonia and reacting Te(OR)$_4$ with ammonia in a sequential, e.g., alternating, manner. The germanium amidinate can be, for example, an amidinate such as GeBAMDN. The amine can be, for example, Ge(NR$_2$)$_4$, wherein R is alkyl group. For example, the amine can be Ge(NCH$_3$)$_4$. Te(OR)$_4$ can be, for example, tetramethoxytelluride (Te(OCH$_3$)$_4$).

Embodiments of the present disclosure, however, are not so limited, and can include selectively forming resistance variable material 122 using other reactants, such as Sb and/or Te compounds in the methoxy, ethoxy, isopropyl, n, and tert butoxy groups. The reactants used in the CVD and/or ALD process can be delivered by a number of carrier gasses, such as N$_2$, argon (Ar), and/or helium (He), as will be appreciated by one of skill in the art.

According to some previous approaches, a resistance variable material was formed, e.g., deposited, in an opening, e.g., cylindrical container, in a semiconductor substrate and/or structure using CVD or ALD. However, in such previous approaches, the CVD or ALD would also result in the resistance variable material being formed on the substrate and/or structure as a conformal layer in addition to being formed in the opening, e.g., the resistance variable material was not selectively formed in the opening. As such, previous approaches would employ an additional processing step to remove the resistance variable material from the substrate and/or structure, e.g., would employ a mask to pattern and remove the resistance variable material, so that the resistance variable material would be located exclusively in the opening. Methods of removing and/or patterning the resistance variable material according to such previous approaches would include chemical-mechanical polishing (CMP), etching, and/or planarizing the resistance variable material. However, such methods may be performed in a different environment than the environment in which the CVD or ALD was performed, e.g., removal and/or patterning of the resistance variable material according to such previous approaches would involve removing the substrate and/or structure from the chamber in which the CVD or ALD was performed. Removing the substrate and/or structure from the CVD or ALD chamber can expose the resistance variable material to oxygen, e.g., can oxidize the resistance variable material, which can adversely affect the resistance variable material.

In contrast, according to a number of embodiments of the present disclosure, removal and/or patterning of resistance variable material 122 can be avoided by selectively forming resistance variable material 122 in opening 112, e.g., forming resistance variable material 122 in opening 112 such that resistance variable material 122 does not form on silicon layer 116, in accordance with a number of embodiments of the present disclosure. That is, CMP, etching, and/or planarization of resistance variable material 122 is avoided because resistance variable material 122 is formed exclusively in opening 112. Further, because removal and/or patterning of resistance variable material 122 does not occur, removal of substrate 102 and/or structure 104 from the environment in which the selective formation of resistance variable material 122 occurs is avoided. Further, because CMP, etching, or planarization of resistance variable material 122 does not occur, oxidation of resistance variable material 122 is avoided. Preventing oxidation of resistance variable material 122 can be beneficial because resistance variable material 122 can be sensitive to oxygen, e.g., exposing resistance variable material 122 to oxygen can adversely affect resistance variable material 122.

Figure 1D:
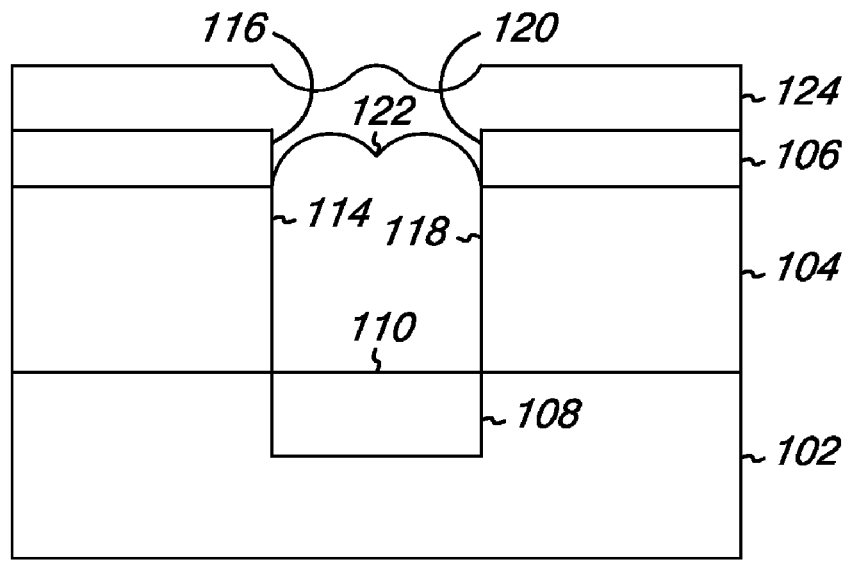
FIG. 1D illustrates a schematic cross-sectional view of a structure on a substrate, with a silicon layer on the structure, a resistance variable material in an opening through the silicon layer and into the structure, and a cap on the silicon layer and the resistance variable material.

FIG. 1D illustrates a schematic cross-sectional view of structure 104 on substrate 102, with silicon layer 106 on structure 104, resistance variable material 122 in opening 112, and a cap 124 on silicon layer 106 and resistance variable material 122. Cap 124 can be an electrode, such as a titanium nitride (TiN) electrode, which can provide an electrical contact to resistance variable material 122. Cap 124 can also be an oxygen barrier, e.g., oxygen may not be able to pass through cap 124.

As shown in FIG. 1D, cap 124 is formed, e.g., deposited, on silicon layer 106 and resistance variable material 122. Cap 124 can be formed on silicon layer 106 and resistance variable material 122 in a number of ways, including CVD and ALD, among other methods, as will be appreciated by one of skill in the art.

In the embodiment illustrated in FIG. 1D, cap 124 is formed such that cap 124 seals resistance variable material 122. Additionally, cap 124 can be formed in situ on silicon layer 106 and resistance variable material 122. That is, cap 124 can be formed on silicon layer 106 and resistance variable material 122 in the same environment, e.g., chamber, in which the selective formation of resistance variable material 122 occurs.

Forming cap 124 in situ and/or forming cap 124 such that cap 124 seals resistance variable material 122 can prevent oxidation of resistance variable material 122, e.g., can prevent resistance variable material 122 from being exposed to oxygen. Preventing oxidation of resistance variable material 122 can be beneficial, as previously described herein. Additionally, forming cap 124 in situ and/or forming cap 124 such that cap 124 seals resistance variable material 122 can reduce and/or eliminate diffusion pathways to and/or from resistance variable material 122.

Figure 1E:
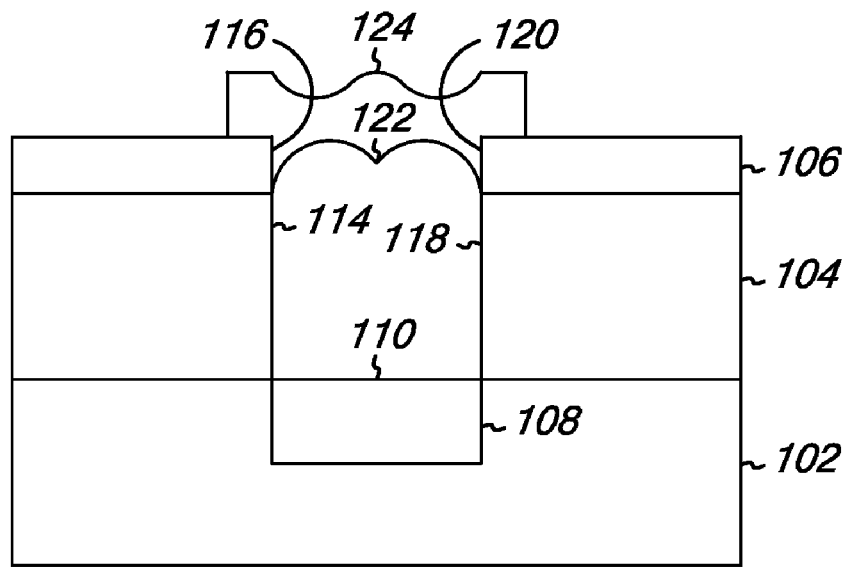
FIG. 1E illustrates a schematic cross-sectional view of a structure on a substrate, with a silicon layer on the structure, a resistance variable material in an opening through the silicon layer and into the structure, and a cap on the silicon layer and the resistance variable material, with portions of the cap removed.

FIG. 1E illustrates a schematic cross-sectional view of structure 104 on substrate 102, with silicon layer 106 on structure 104, resistance variable material 122 in opening 112, and a cap 124 on silicon layer 106 and resistance variable material 122, with portions of cap 124 removed. The removed portions of cap 124 can be removed in a number of ways, as will be appreciated by one of skill in the art. For example, the removed portions of cap 124 can be removed by etching and/or patterning cap 124. Further, the removed portions of cap 124 can be removed such that resistance variable material 122 remains sealed by cap 124, as shown in FIG. 1E. That is, the portions of cap 124 that are removed can include portions of cap 124 that, if removed, do not affect the sealing of resistance variable material 122. Removing portions of cap 124 can decrease the size, e.g., width of a semiconductor device, e.g., memory cell, which can increase the number of semiconductor devices, e.g., memory cells, which can be formed on a semiconductor wafer.

The removed portions of cap 124 may or may not be removed in situ. However, if the removed portions of cap 124 are not removed in situ, resistance variable material 122 will not be exposed to oxygen, because resistance variable material 122 has been sealed by cap 124.

Figure 2:
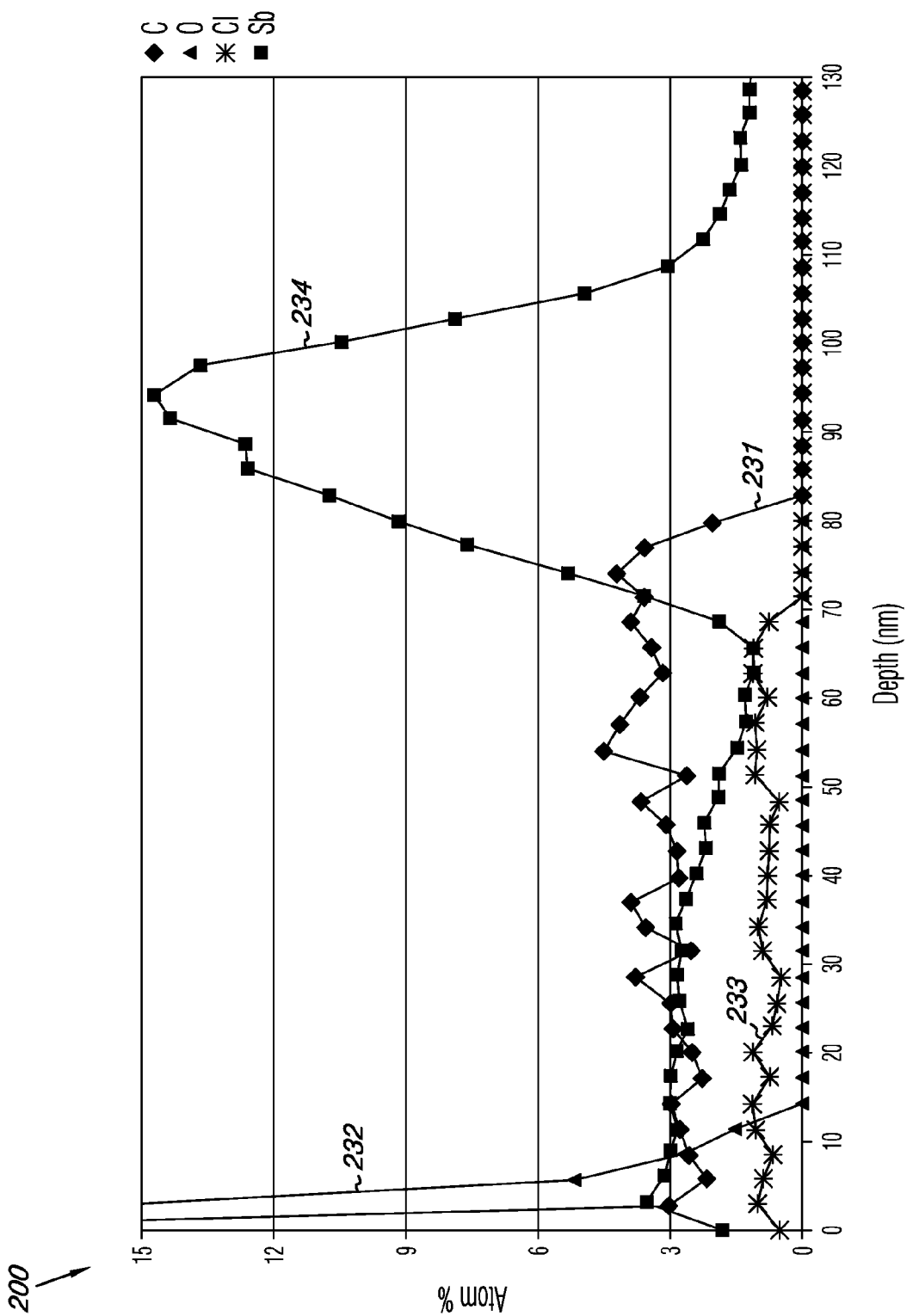
FIG. 2 is a graph of test results illustrating the atomic percentage of a number of elements at a number of depths of a semiconductor device processed in accordance with a number of embodiments of the present disclosure.

FIG. 2 is a graph 200 of test results illustrating the atomic percentage of a number of elements at a number of depths of a semiconductor device processed, e.g., created, in accordance with a number of embodiments of the present disclosure. That is, graph 200 illustrates the atomic percentage of a number of elements at a number of depths of a semiconductor device having a schematic cross-sectional view analogous to the schematic cross-sectional view shown in FIG. 1E. The semiconductor device includes a cap analogous to cap 124 at a depth of approximately 0 nm to approximately 47 nm, and the semiconductor device includes resistance variable material analogous to resistance variable material 122 at a depth of approximately 47 nm to approximately 123 nm.

As shown in FIG. 2, graph 200 includes lines 231, 232, 233, and 234. Line 231 represents the atomic percentage, e.g., concentration, of carbon at a number of depths of the semiconductor device. Line 232 represents the atomic percentage of oxygen at a number of depths of the semiconductor device. Line 233 represents the atomic percentage of chlorine at a number of depths of the semiconductor device. Line 234 represents the atomic percentage of antimony at a number of depths of the semiconductor device.

As shown in FIG. 2, the atomic percentage of oxygen at a depth of approximately 47 nm to approximately 123 nm, e.g., the depth of a semiconductor device according to a particular design rule which includes the resistance variable material, is zero. That is, the resistance variable material does not include any oxygen. The absence of oxygen in the resistance variable material can indicate that the resistance variable material was not exposed to oxygen during processing of the semiconductor device, in accordance with one or more embodiments of the present disclosure. That is, graph 200 can demonstrate that selectively forming the resistance variable material in an opening of the semiconductor device, forming the cap in situ and/or forming the cap such that the cap seals the resistance variable material can prevent oxidation of the resistance variable material, in accordance with one or more embodiments of the present disclosure.

CONCLUSION

Devices, methods, and systems for semiconductor processing are described herein. A number of method embodiments of semiconductor processing can include forming a silicon layer on a structure, forming an opening through the silicon layer and into the structure, and selectively forming a resistance variable material in the opening such that the resistance variable material does not form on the silicon layer.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of semiconductor processing, comprising:
   forming a silicon layer on a structure;
   forming an opening through the silicon layer and into the structure;
   forming in a selective area a resistance variable material in the opening such that the resistance variable material does not form on the silicon layer;
   forming a cap in situ on the resistance variable material and silicon layer in a same chamber in which the formation of the resistance variable material occurs; and
   removing a portion of the cap that is on the silicon layer.

2. The method of claim 1, wherein the method includes forming an oxygen barrier on the resistance variable material.

3. The method of claim 2, wherein forming the oxygen barrier includes sealing the resistance variable material in situ.

4. The method of claim 1, wherein forming the resistance variable material includes:
   reacting a germanium amidinate with $NH_3$; and
   reacting $Sb(OR)_3$ with $NH_3$, wherein R is an alkyl.

5. The method of claim 1, wherein forming the resistance variable material includes:
   reacting a germanium amidinate with $NH_3$; and
   reacting $Te(OR)_4$ with $NH_3$, wherein R is an alkyl.

6. The method of claim 1, wherein forming the resistance variable material includes:
   reacting $Ge(NR_2)_4$ with $NH_3$; and
   reacting $Sb(OR)_3$ with $NH_3$;
   wherein R is an alkyl.

7. The method of claim 1, wherein forming the resistance variable material includes:
   reacting $Ge(NR_2)_4$ with $NH_3$; and
   reacting $Te(OR)_4$ with $NH_3$;
   wherein R is an alkyl.

8. The method of claim 1, wherein the opening has a width less than or equal to 35 nm.

9. A method of semiconductor processing, comprising:
   depositing a silicon layer on a structure;
   removing a portion of the silicon layer and a portion of the structure to form a cylindrical container therein;
   depositing in a selective area a phase change material in the cylindrical container such that no phase change material is deposited on the silicon layer;
   forming a cap in situ on the phase change material and silicon layer in a same chamber in which the deposition of the phase change material occurs; and
   removing a portion of the cap that is on the silicon layer.

10. The method of claim 9, wherein the method includes forming the cap in situ on the phase change material such that oxidation of the phase change material is prevented.

11. The method of claim 9, wherein the cap is an electrode.

12. The method of claim 9, wherein the phase change material is a Ge—Sb material.

13. The method of claim 9, wherein the phase change material is a Ge—Te material.

14. The method of claim 9, wherein the cylindrical container has an aspect ratio greater than or equal to 2:1.

15. A method of semiconductor processing, comprising:
- forming a structure on a substrate, wherein the substrate includes an electrode;
- forming a silicon layer on the structure;
- forming an opening through the silicon layer and the structure, wherein:
  - a surface of the electrode defines a bottom of the opening;
  - a first surface of the structure and a first surface of the silicon layer define a first sidewall of the opening; and
  - a second surface of the structure and a second surface of the silicon layer define a second sidewall of the opening;
- forming in a selective area a resistance variable material in the opening such that the resistance variable material does not form on the silicon layer layer;
- forming a cap in situ on the resistance variable material and silicon layer in a same chamber in which the formation of the resistance variable material occurs; and
- removing a portion of the cap that is on the silicon layer.

16. The method of claim 15, wherein the method does not include removing any portion of the resistance variable material.

17. The method of claim 15, wherein forming the resistance variable material includes forming the resistance variable material such that the resistance variable material covers the bottom of the opening and the first and second surfaces of the structure but not the first and second surfaces of the silicon layer.

18. The method of claim 15, wherein forming the resistance variable material includes forming the resistance variable material such that the resistance variable material fills a portion of the opening formed by the bottom of the opening and the first and second surfaces of the structure.

\* \* \* \* \*

UNITED STATES PATENT AND TRADEMARK OFFICE
CERTIFICATE OF CORRECTION

| | | |
|---|---|---|
| PATENT NO. | : 8,003,521 B2 | Page 1 of 1 |
| APPLICATION NO. | : 12/419779 | |
| DATED | : August 23, 2011 | |
| INVENTOR(S) | : Eugene P. Marsh et al. | |

It is certified that error appears in the above-identified patent and that said Letters Patent is hereby corrected as shown below:

In column 9, line 20, in claim 15, delete "layer layer;" and insert -- layer; --, therefor.

Signed and Sealed this
Eighteenth Day of October, 2011

David J. Kappos
*Director of the United States Patent and Trademark Office*